United States Patent
Iizuka et al.

(10) Patent No.: US 12,191,218 B2
(45) Date of Patent: Jan. 7, 2025

(54) SEMICONDUCTOR DEVICE INCLUDING SURFACE PRESSURE ABSORBING MEMBER FOR FASTENING HEAT SINK

(71) Applicant: Mitsubishi Electric Corporation, Tokyo (JP)

(72) Inventors: Arata Iizuka, Tokyo (JP); Korehide Okamoto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 805 days.

(21) Appl. No.: 16/754,992

(22) PCT Filed: Nov. 22, 2017

(86) PCT No.: PCT/JP2017/041950
§ 371 (c)(1),
(2) Date: Apr. 9, 2020

(87) PCT Pub. No.: WO2019/102537
PCT Pub. Date: May 31, 2019

(65) Prior Publication Data
US 2021/0202330 A1  Jul. 1, 2021

(51) Int. Cl.
*H01L 23/049* (2006.01)
*H01L 23/00* (2006.01)
(Continued)

(52) U.S. Cl.
CPC ........ *H01L 23/049* (2013.01); *H01L 23/3672* (2013.01); *H01L 23/3735* (2013.01);
(Continued)

(58) Field of Classification Search
CPC ...................................................... H01L 23/049
(Continued)

(56) References Cited

U.S. PATENT DOCUMENTS 5,444,295 A * 8/1995 Lake ................... H01L 23/66
257/678
6,122,170 A * 9/2000 Hirose ................ C04B 37/026
174/16.3
(Continued)

FOREIGN PATENT DOCUMENTS

DE  112013007047 T5  1/2016
DE  112013007390 T5  5/2016
(Continued)

OTHER PUBLICATIONS

International Search Report issued in PCT/JP2017/041950; mailed Feb. 6, 2018.
(Continued)

*Primary Examiner* — Ajay Arora
(74) *Attorney, Agent, or Firm* — Studebaker & Brackett PC (57) ABSTRACT

A semiconductor device includes a semiconductor element, a heat sink on which the semiconductor element is mounted, and a case made of resin, the case being mounted on the heat sink and containing the semiconductor element. A fastening hole is formed passing through the case and the heat sink. The case includes a surface pressure absorbing member on a portion including the fastening hole in plan view, the surface pressure absorbing member having a plate shape and being higher in rigidity than the resin.

20 Claims, 11 Drawing Sheets

(51) Int. Cl.
*H01L 23/367* (2006.01)
*H01L 23/373* (2006.01)
*H01L 25/07* (2006.01)

(52) U.S. Cl.
CPC .............. *H01L 24/32* (2013.01); *H01L 24/48* (2013.01); *H01L 24/73* (2013.01); *H01L 25/072* (2013.01); *H01L 2224/32225* (2013.01); *H01L 2224/48137* (2013.01); *H01L 2224/48225* (2013.01); *H01L 2224/73265* (2013.01); *H01L 2924/1203* (2013.01); *H01L 2924/13055* (2013.01); *H01L 2924/13091* (2013.01); *H01L 2924/15787* (2013.01)

(58) Field of Classification Search
USPC ........................................................ 257/694
See application file for complete search history.

(56) References Cited

U.S. PATENT DOCUMENTS

| | | | | |
|---|---|---|---|---|
| 2002/0154486 A1* | 10/2002 | Koike | ................. | H05K 5/0073 |
| | | | | 361/704 |
| 2013/0056937 A1* | 3/2013 | Watermann | ............... | F16L 5/10 |
| | | | | 277/606 |
| 2016/0079155 A1 | 3/2016 | Kawase et al. | | |
| 2016/0111345 A1 | 4/2016 | Kawase et al. | | |
| 2017/0194296 A1* | 7/2017 | Yasui | .................... | H01L 25/072 |

FOREIGN PATENT DOCUMENTS

| | | | | |
|---|---|---|---|---|
| JP | 2000082774 A | | 3/2000 | |
| JP | 2003-133756 A | | 5/2003 | |
| JP | 2012028552 A | * | 2/2012 | ........... H01L 23/053 |
| JP | 2014-179376 A | | 9/2014 | |

OTHER PUBLICATIONS

An Office Action issued by the German Patent Office on May 27, 2022, which corresponds to German Patent Application No. 112017008226.9 and is related to U.S. Appl. No. 16/754,992; with English language translation.

An Office Action mailed by China National Intellectual Property Administration on Mar. 8, 2023, which corresponds to Chinese Patent Application No. 201780096912.5 and is related to U.S. Appl. No. 16/754,992; with English language translation.

An Office Action mailed by China National Intellectual Property Administration on Sep. 28, 2023, which corresponds to Chinese Patent Application No. 201780096912.5 and is related to U.S. Appl. No. 16/754,992; with English language translation.

* cited by examiner

SEMICONDUCTOR DEVICE INCLUDING SURFACE PRESSURE ABSORBING MEMBER FOR FASTENING HEAT SINK

TECHNICAL FIELD

The present invention relates to a semiconductor device, and more particularly, to a cooling structure for a power semiconductor device.

BACKGROUND ART

An increase in output and a reduction in size of a power semiconductor device (power module) having high reliability have been required. In order to meet the requirement, not only an increase in capacity of a semiconductor element mounted on a semiconductor device, but also a semiconductor device employing a direct cooling structure including a heat sink with fins has been studied. In such a semiconductor device having a direct cooling structure, in order to prevent cooling water from leaking, it is often required that the semiconductor device be fastened to the heat sink with fastening torque higher than fastening torque applied to a conventional semiconductor device that is cooled via grease.

Such a heat sink is often made of an aluminum-based material from the viewpoint of corrosion resistance and weight reduction. Therefore, a configuration where the semiconductor device and the heat sink are directly fastened to each other with a bolt raises a concern about deformation of the heat sink such as depression on the heat sink due to stress (surface pressure) applied through the bolt.

For example, Patent Document 1 discloses a technique of forming a metal layer on a portion where a ceramic substrate and a bolt comes into contact with each other in a semiconductor device having a structure where the ceramic substrate on which a semiconductor element is mounted is fixed to a heat sink (heat dissipating plate) with the bolt so as to prevent stress from concentrating on the portion.

PRIOR ART DOCUMENTS

Patent Documents

Patent Document 1: Japanese Patent Application Laid-Open No. 2000-082774

SUMMARY

Problem to be Solved by the Invention

It is difficult to apply the technique disclosed in Patent Document 1 to a semiconductor device having a structure where a semiconductor element is contained in a resin case. This is because it is difficult to form, on the resin of which the case is made, a metal layer that can relieve the stress from the bolt.

There is another technique of inserting a cylindrical surface pressure absorbing member called a "collar" made of a highly rigid material into a fastening hole for fastening a resin case to a heat sink with a bolt. In consideration of productivity, the collar is formed integrally with the resin case by insert molding. In other words, when the case is manufactured, the collar and the case are integrally formed by fixing the collar in a mold for molding the case and injecting resin around the collar. However, when high fastening torque is required for the bolt, the collar is separated from the case due to the fastening torque, which may in turn cause the collar to idly spin or the case to crack.

The present invention has been made to solve the above problems, and an object of the present invention is to suppress deformation of a heat sink during fastening with a bolt in a semiconductor device including a resin case.

Means to Solve the Problem

A semiconductor device according to the present invention includes a semiconductor element, a heat sink on which the semiconductor element is mounted, a case made of resin, the case being mounted on the heat sink and containing the semiconductor element, and a fastening hole passing through the case and the heat sink.

The case includes a surface pressure absorbing member on a portion including the fastening hole in plan view, the surface pressure absorbing member having a plate shape and being high in rigidity than the resin.

Effects of the Invention

According to the present invention, since the surface pressure absorbing member has a plate shape, it is possible to increase adhesion to the resin of the case. Further, since the stress (surface pressure) applied to the case and the heat sink during fastening with a bolt is suppressed, it is possible to prevent the heat sink from being deformed.

The objects, features, aspects, and advantages of the present invention will become more apparent from the following detailed description and the accompanying drawings.

DESCRIPTION OF EMBODIMENTS

First Embodiment

Figure 1:
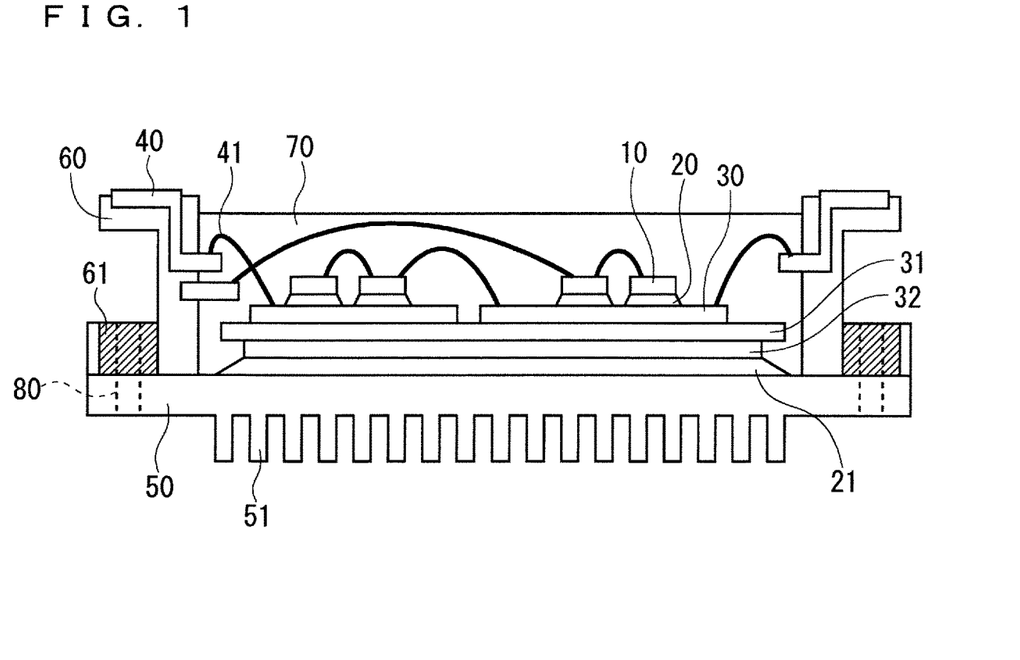
FIG. 1 is a cross-sectional view of a semiconductor device according to a first embodiment.

FIG. 1 is a cross-sectional view of a semiconductor device according to a first embodiment of the present invention. As shown in FIG. 1, the semiconductor device includes a semiconductor element 10 contained in a case 60 made of resin and a heat sink 50 on which the case 60 is mounted.

The semiconductor element 10 is a power semiconductor element such as an insulated gate bipolar transistor (IGBT), a metal-oxide semiconductor field-effect transistor (MOSFET), or a free wheeling diode (FWDi). A lower surface of the semiconductor element 10 is bonded to a circuit pattern 30 formed on an insulation substrate 31 with brazing filler metal 20. The insulation substrate 31 is made of an insulation material such as aluminum nitride (AlN). The circuit pattern 30 serves as a path for supplying a specific potential to the semiconductor element 10 and is made of a conductive material such as aluminum (Al) or copper (Cu).

Formed on a lower surface of the insulation substrate 31 is a metal pattern 32 made of, for example, Al or Cu, and the metal pattern 32 is bonded to an upper surface of the heat sink 50 with the brazing filler metal 21. Note that the metal pattern 32 and the heat sink 50 may be bonded to each other using a technique such as solid phase diffusion bonding or die casting without using the brazing filler metal 21. Further, the brazing filler metal 21 and the insulation substrate 31 may be directly bonded to each other without providing the metal pattern 32 on the lower surface of the insulation substrate 31.

The heat sink 50 is made of a material having high thermal conductivity and corrosion resistance. Examples of the material of the heat sink 50 include Al and an alloy primarily containing Al. Further, for example, pin-like or plate-like heat dissipation fins 51 are provided on a lower surface of the heat sink 50, so that the heat sink 50 can be directly cooled by a cooling solvent.

Further, the semiconductor element 10 and the circuit pattern 30 are connected, through wiring 41, to an external electrode 40 provided on the case 60. The wiring 41 and the external electrode 40 are made of a conductive material such as Al or Cu. Herein, the external electrode 40 is connected to the semiconductor element 10 and the circuit pattern 30 using the wiring 41 made of wires, but, for example, a direct lead bonding structure may be employed where the external electrode 40 is directly brazed to the semiconductor element 10 or the circuit pattern 30. The external electrode 40 is a terminal for connecting external wiring and is formed integrally with the case 60 by insert molding.

The case 60 is fully filled with an encapsulating material 70 made of, for example, silicone gel or epoxy resin. Note that the case 60 and the encapsulating material 70 may be integrally molded using mold resin.

Formed passing through the case 60 and the heat sink 50 is a fastening hole 80. The case 60 and the heat sink 50 are fastened to an external housing such as a cooling jacket with a bolt (not shown) inserted into the fastening hole 80.

Herein, the case 60 includes a surface pressure absorbing member 61 on a region including the fastening hole 80 in plan view, the surface pressure absorbing member 61 having a plate shape and being higher in rigidity than the resin of the case 60. The surface pressure absorbing member 61 is formed integrally with the case 60 by insert molding. Examples of a material of the surface pressure absorbing member 61 include iron (Fe). The surface pressure absorbing member 61 preferably has a thickness of at least 0.5 mm.

Figure 2:
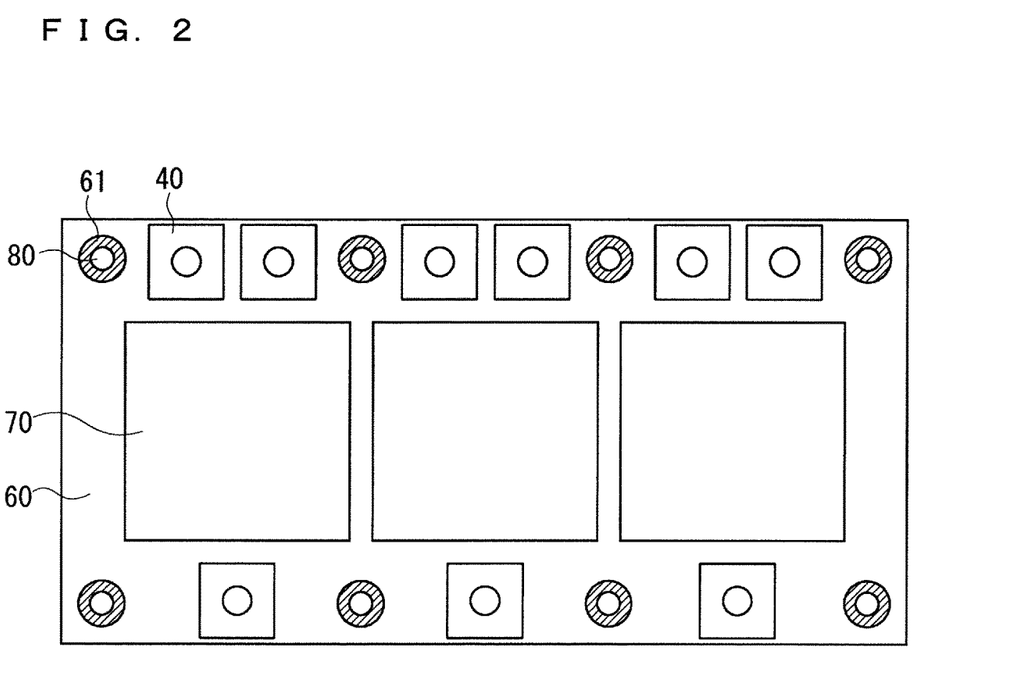
FIG. 2 is a top view of the semiconductor device according to the first embodiment.
Figure 3:
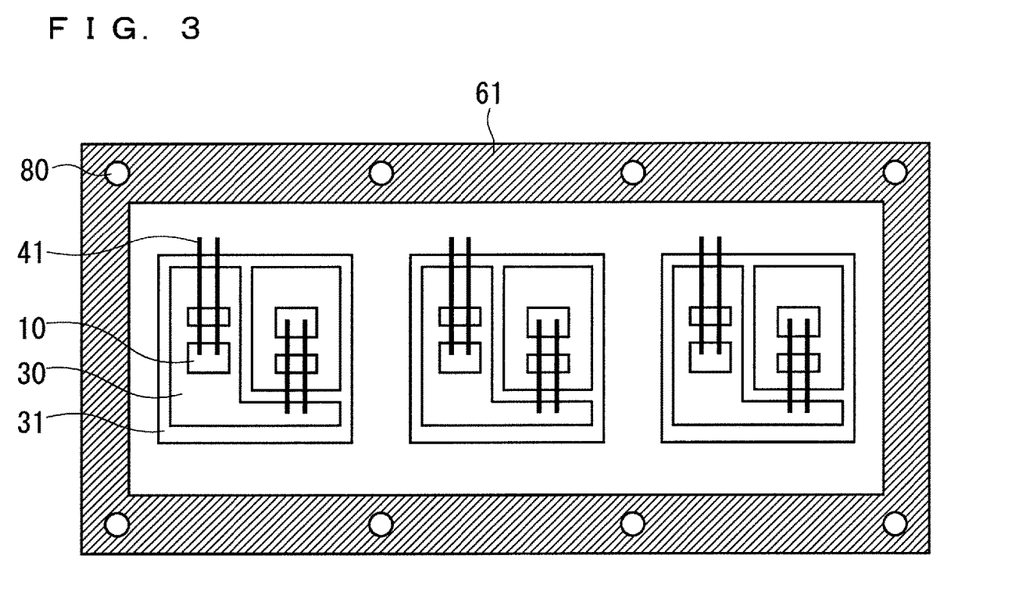
FIG. 3 is a top view of the semiconductor device according to the first embodiment where an external electrode, a resin portion of a case, and a heat sink are made transparent.

FIG. 2 is a top view of the semiconductor device shown in FIG. 1, and FIG. 3 is a plan view of the semiconductor device where the external electrode 40, a resin portion of the case 60 (that is, a portion other than the surface pressure absorbing member 61), and the heat sink 50 are made transparent. Herein, a "6 in 1 structure" semiconductor device where six circuits using the semiconductor elements 10 are contained in the case 60 is shown, but, for example, "1 in 1 structure" or "2 in 1 structure" may be employed.

As shown in FIG. 3, the surface pressure absorbing member 61 is disposed on a portion including the fastening holes 80 in plan view. That is, the fastening hole 80 is formed in the surface pressure absorbing member 61. An upper surface of the surface pressure absorbing member 61 at at least a portion around the fastening hole 80 (a portion in contact with the bolt) is exposed from the resin of the case 60. Further, a lower surface of the surface pressure absorbing member 61 is in contact with the heat sink 50. Accordingly, the surface pressure absorbing member 61 is interposed between a head of the bolt inserted into the fastening hole 80 and the heat sink 50. Further, a washer may be interposed between the head of the bolt and the surface pressure absorbing member 61.

In the present embodiment, the surface pressure absorbing member 61 has a frame shape extending on an outer peripheral portion of the case 60 and is formed in a single plate shape including all the fastening holes 80 in plan view. Compared to a cylindrical surface pressure absorbing member (collar), the surface pressure absorbing member 61 having a plate shape has a large contact area with respect to the resin of the case 60 and can be thus high in adhesion to the resin. Further, stress (surface pressure) applied to the case 60 and the heat sink 50 during fastening with the bolt is reduced. This prevents the heat sink 50 from being deformed, the surface pressure absorbing member 61 from being separated from the resin of the case 60, and the case 60 from being damaged. This in turn increases user-friendliness. In particular, when one surface pressure absorbing member 61 includes a plurality of fastening holes 80, stress applied from the surface pressure absorbing member 61 to the heat sink 50 can be effectively reduced.

Figure 4:
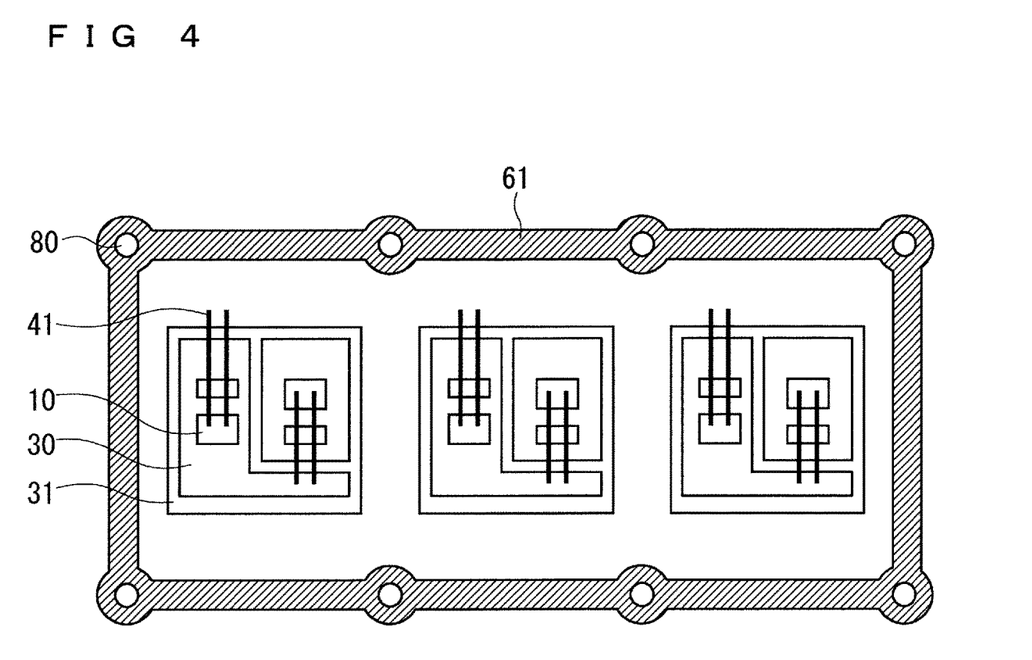
FIG. 4 is a diagram for describing a modification of a surface pressure absorbing member in the first embodiment.

Note that corner portions of the surface pressure absorbing member 61 may be beveled (for example, rounded or chamfered). Further, as shown in FIG. 4, a portion other than the region around the fastening hole 80 (the region in contact with the bolt or washer) may be narrowed to reduce the usage of material and material cost.

Furthermore, a configuration where the surface pressure absorbing member 61 that is high in rigidity extends within the semiconductor device is also expected to bring about an effect of suppressing warpage of the semiconductor device (hereinafter referred to as "warpage suppressing effect"). Further, since Fe of which the surface pressure absorbing member 61 is made is higher in thermal conductivity than the resin of the case 60, the surface pressure absorbing member 61 also contributes to heat dissipation of the semiconductor device. The surface pressure absorbing member 61 having a plate shape is larger in surface area than a cylindrical surface pressure absorbing member, which is expected to bring about an effect of increasing cooling performance (hereinafter referred to as "cooling effect").

Figure 5:
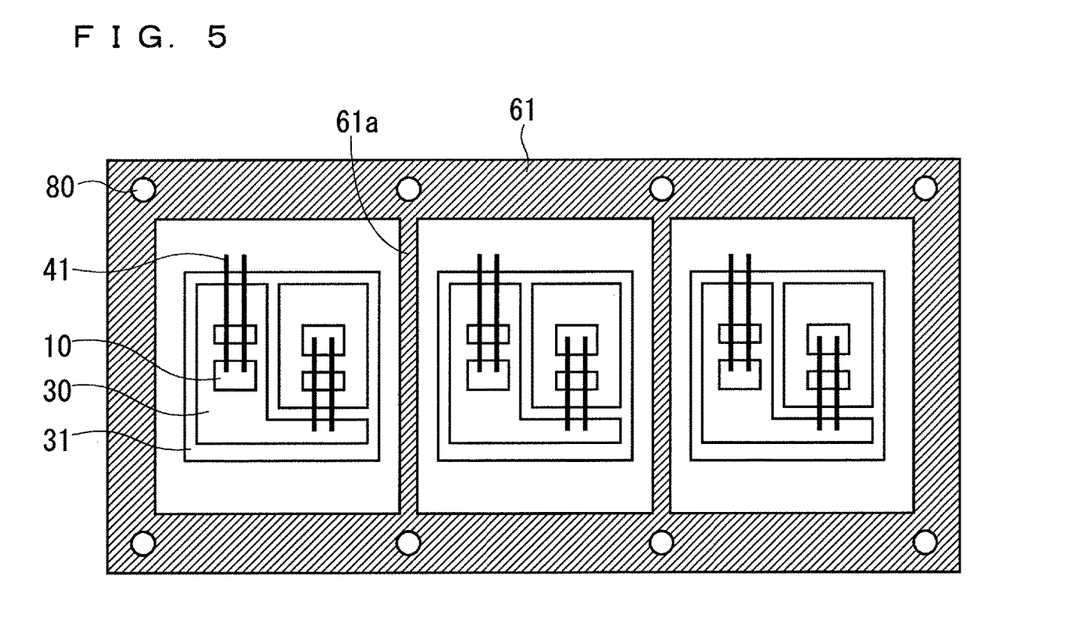
FIG. 5 is a diagram for describing a modification of the surface pressure absorbing member in the first embodiment.

Further, for example, as shown in FIG. 5, the surface pressure absorbing member 61 may be provided with a beam portion 61a extending across an inside of the case 60. That is, the surface pressure absorbing member 61 includes a portion extending on the outer peripheral portion of the case 60 and a portion (beam portion 61a) extending across the inside of the case 60. This configuration is expected to further increase the warpage suppressing effect and the cooling effect.

Note that, in the above description, the surface pressure absorbing member 61 is made of iron (Fe), but the surface pressure absorbing member 61 may be made of a material such as copper (Cu) that is higher in thermal conductivity than iron. This configuration is expected to further increase the cooling effect.

Further, the surface pressure absorbing member 61 may be made of the same material as the material of the bolt (and washer) used for fastening. Examples of the material of the bolt typically include stainless steel, brass, titanium, chrome molybdenum. The configuration where the surface pressure absorbing member 61 and the bolt are made of the same material is expected to suppress stress generated at a high temperature and further reduce the stress applied to the heat sink 50.

Second Embodiment

In a second embodiment, a plurality of the surface pressure absorbing members 61 are provided on the case 60 of the semiconductor device. FIG. 6 to FIG. 11 are diagrams showing configuration examples of a semiconductor device according to the second embodiment and are top views of the semiconductor device where the external electrode, the resin portion of the case, and the heat sink are made transparent.

Figure 6:
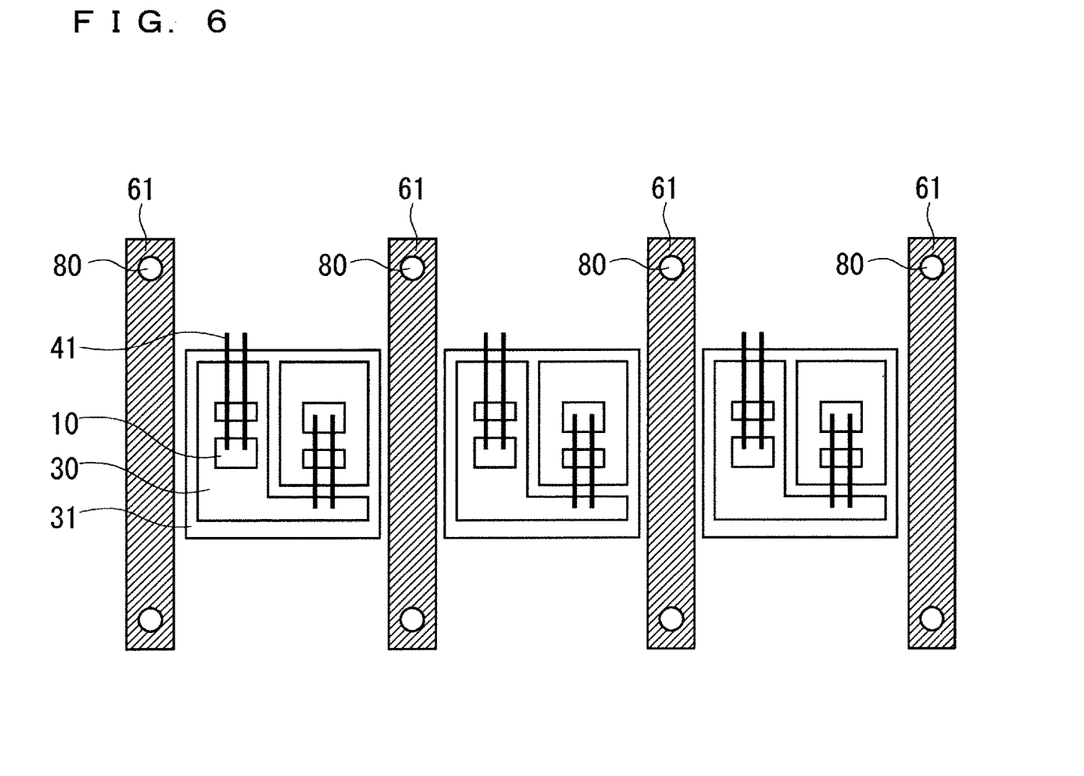
FIG. 6 is a top view of a semiconductor device according to a second embodiment where an external electrode, a resin portion of a case, and a heat sink are made transparent.
Figure 7:
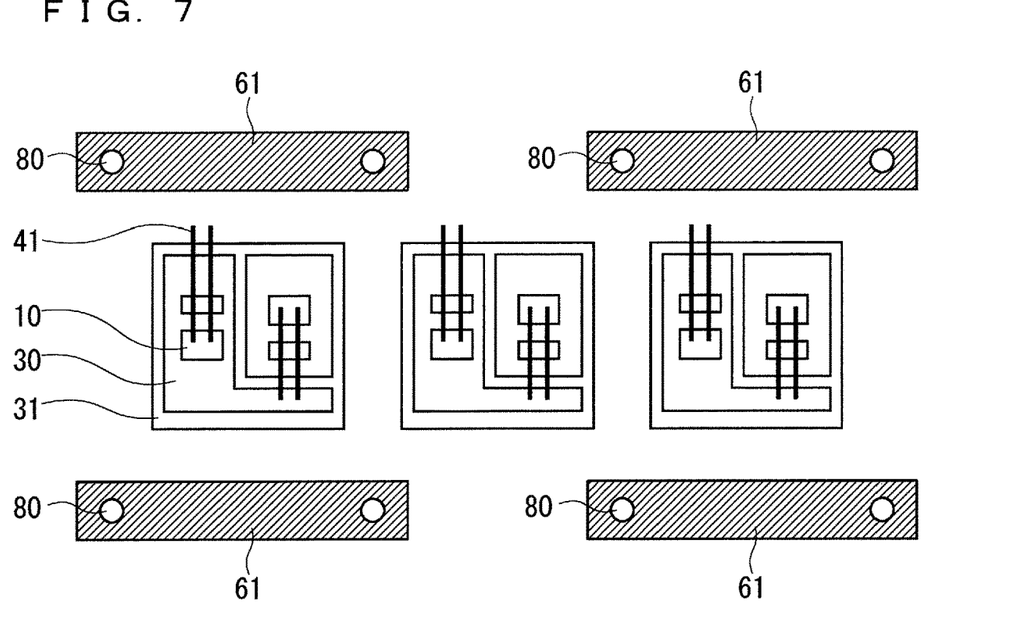
FIG. 7 is a top view of the semiconductor device according to the second embodiment where the external electrode, the resin portion of the case, and the heat sink are made transparent.

For example, as shown in FIG. 6 or FIG. 7, when the number of fastening holes 80 is an even number (eight), a plurality of (four) surface pressure absorbing members 61 each having a shape including two fastening holes 80 in plan view may be provided. FIG. 6 shows an example where four surface pressure absorbing members 61 extending in a width direction of the case 60 are arranged side by side in a longitudinal direction of the case 60. FIG. 7 shows an example where two surface pressure absorbing members 61 extending in the longitudinal direction of the case 60 are arranged on each long side of the case 60.

A configuration where a plurality of surface pressure absorbing members 61 are provided can also bring about the effect of suppressing stress (surface pressure) applied to the case 60 and the heat sink 50 during fastening with the bolt as in the first embodiment.

Further, although the warpage suppressing effect and the cooling effect are small compared to the first embodiment, a reduction in size of each surface pressure absorbing member 61 is expected to reduce the material cost and weight. Furthermore, a configuration where the plurality of surface pressure absorbing members 61 have the same shape can suppress an increase in the number of types of components and can thus increase productivity.

Figure 8:
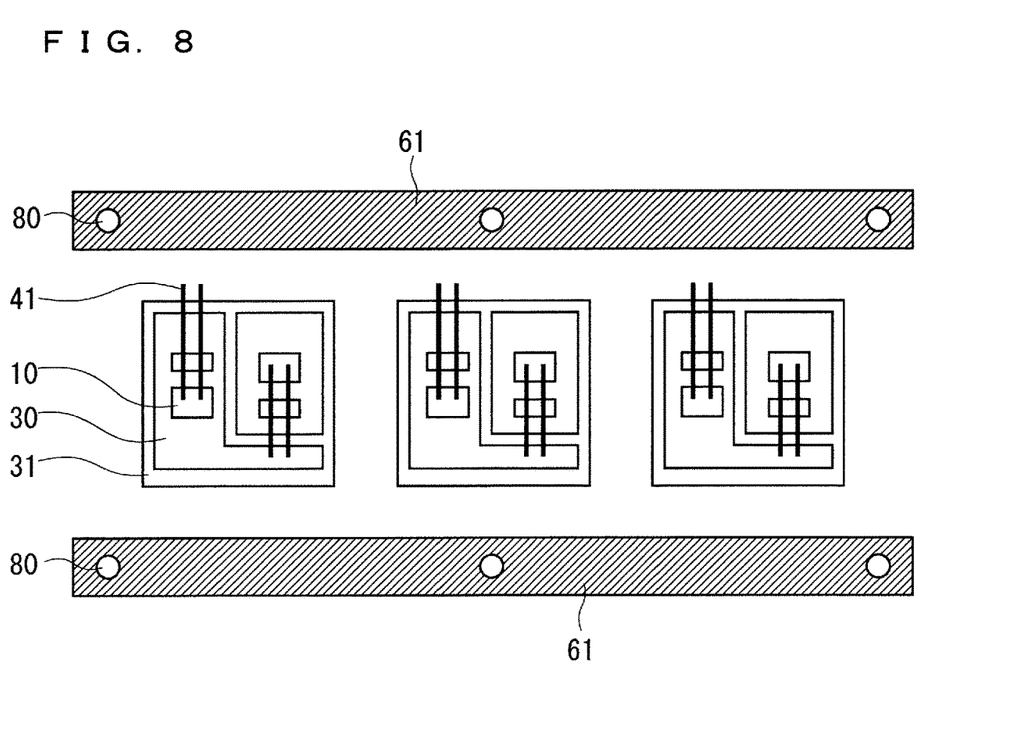
FIG. 8 is a top view of the semiconductor device according to the second embodiment where the external electrode, the resin portion of the case, and the heat sink are made transparent.
Figure 9:
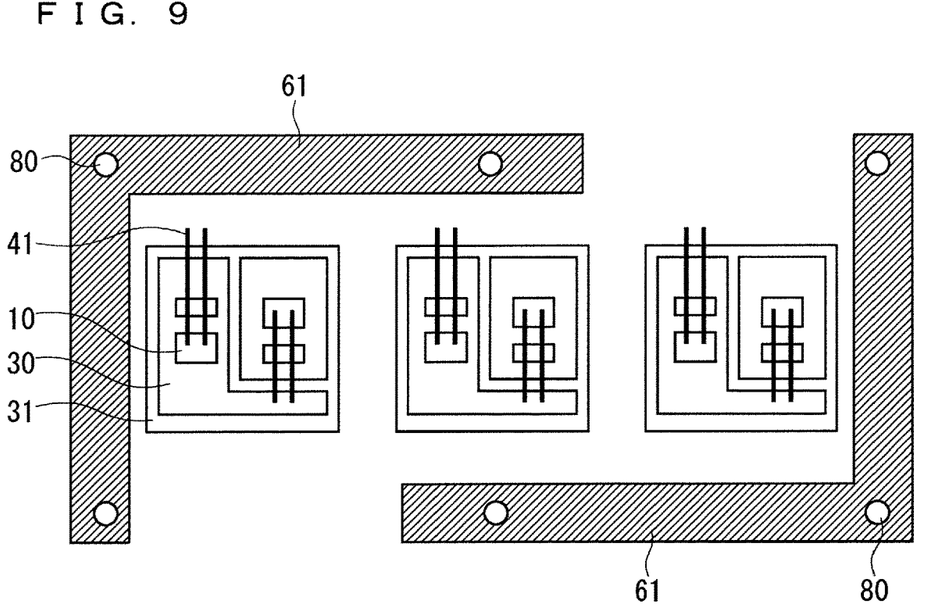
FIG. 9 is a top view of the semiconductor device according to the second embodiment where the external electrode, the resin portion of the case, and the heat sink are made transparent.

Further, for example, as shown in FIG. 8 or FIG. 9, when the number of fastening holes 80 is a multiple of three (six), a plurality of (two) surface pressure absorbing members 61 each having a shape including three fastening holes 80 in plan view may be provided. FIG. 8 shows an example where the surface pressure absorbing member 61 extending in the longitudinal direction of the case 60 is disposed on each long side of the case 60. FIG. 9 shows an example where two L-shaped surface pressure absorbing members 61 extending on two adjacent sides of the case 60 are arranged point-symmetrically.

Compared to the examples shown in FIG. 6 and FIG. 7, the size of each surface pressure absorbing member 61 is increased, and the number of surface pressure absorbing members 61 is reduced. This can achieve both a reduction in material cost, and the warpage suppressing effect and cooling effect. Further, as shown in FIG. 9, a configuration where the surface pressure absorbing members 61 have an L shape can bring about a high warpage suppressing effect.

Figure 10:
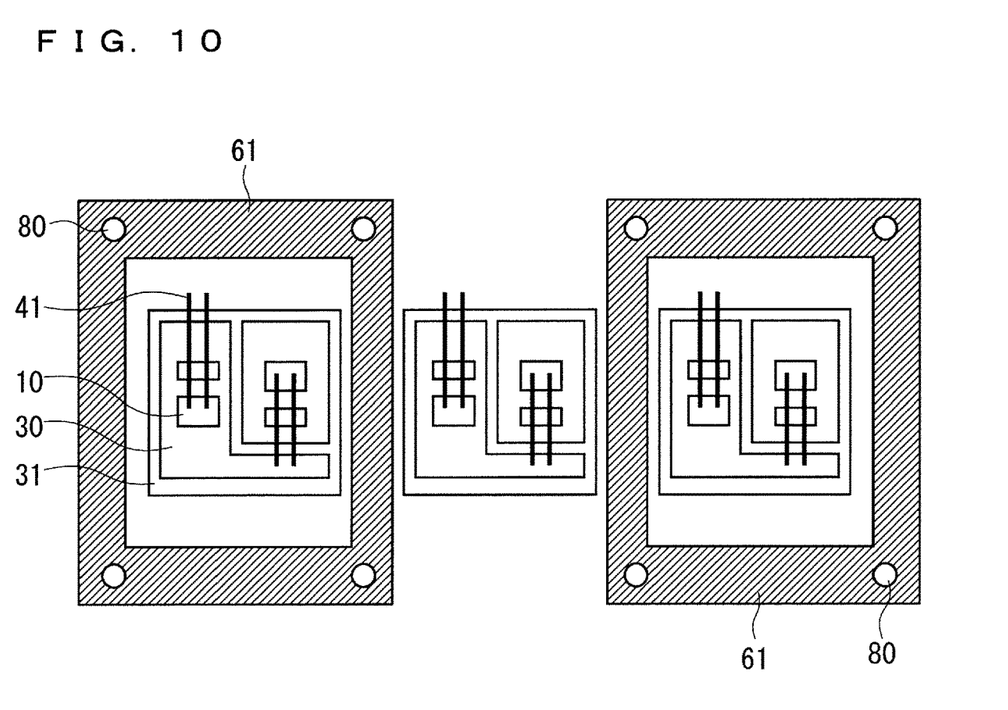
FIG. 10 is a top view of the semiconductor device according to the second embodiment where the external electrode, the resin portion of the case, and the heat sink are made transparent.
Figure 11:
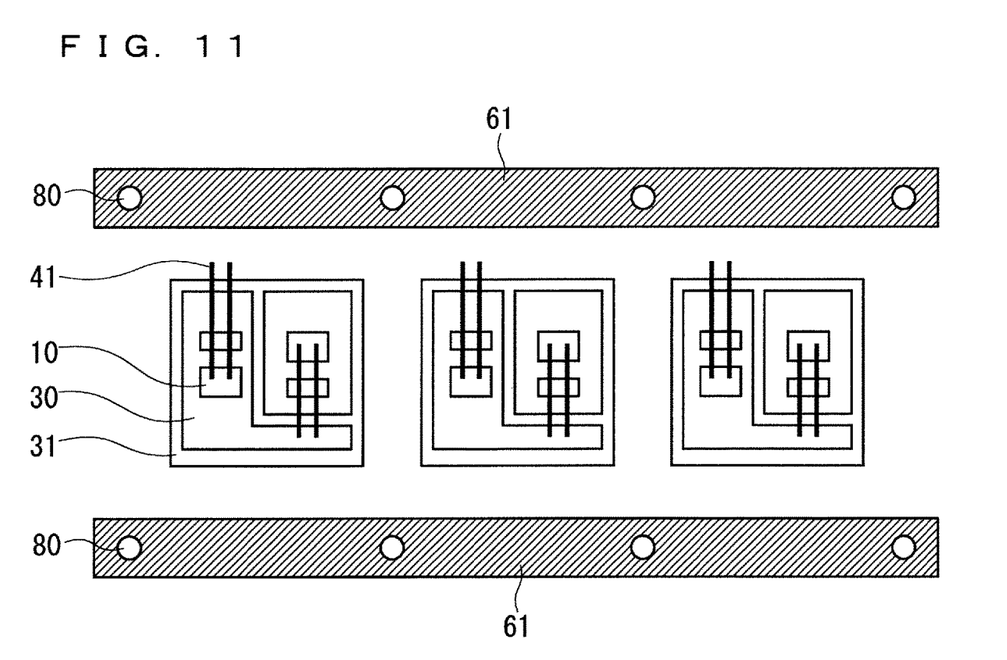
FIG. 11 is a top view of the semiconductor device according to the second embodiment where the external electrode, the resin portion of the case, and the heat sink are made transparent.

Further, for example, as shown in FIG. 10 or FIG. 11, when the number of fastening holes 80 is a multiple of four (eight), a plurality of (two) surface pressure absorbing members 61 each having a shape including four fastening holes 80 in plan view may be provided. FIG. 10 shows an example where two frame-shaped surface pressure absorbing members 61 are arranged side by side in the longitudinal direction of the case 60. FIG. 11 shows an example where the surface pressure absorbing member 61 extending in the longitudinal direction of the case 60 is disposed on each long side of the case 60.

This configuration can also achieve both a reduction in material cost, and the warpage suppressing effect and cooling effect. Further, as shown in FIG. 10, the configuration where the two surface pressure absorbing members 61 are formed in a frame shape causes a side of each of the surface pressure absorbing members 61 extending across the case 60 to serve as the beam portion 61a shown in FIG. 5 and can thus bring about a high warpage suppressing effect.

Third Embodiment

Although the upper surface and side surfaces of the surface pressure absorbing member 61 shown in the first and second embodiments are flat, the surface pressure absorbing member 61 in the third embodiment has a holes or projections and depressions formed in a portion other than the portion around the fastening hole 80 (the region in contact with the bolt or washer).

Figure 12:
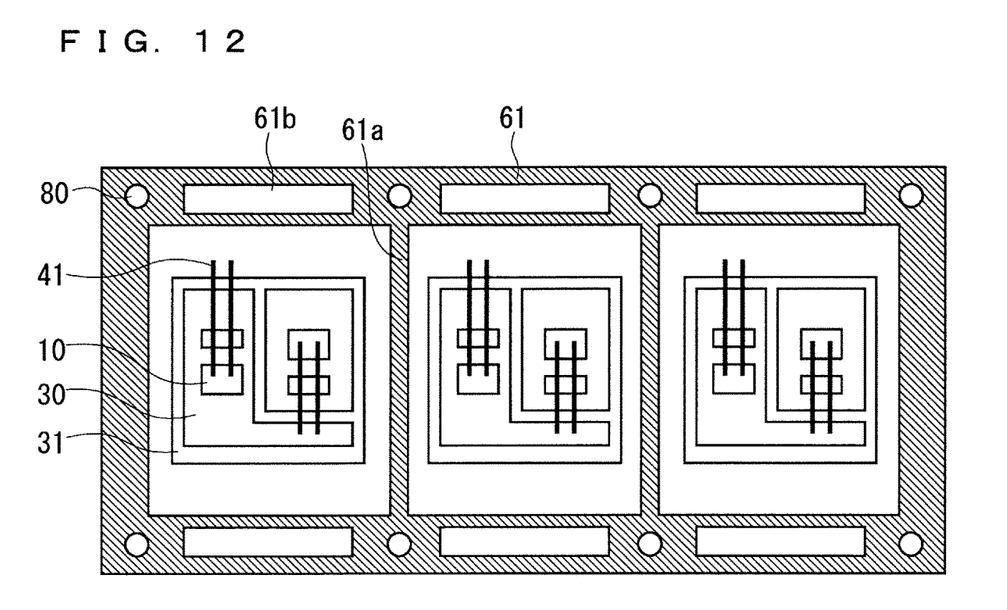
FIG. 12 is a top view of a semiconductor device according to a third embodiment where an external electrode, a resin portion of a case, and a heat sink are made transparent.
Figure 13:
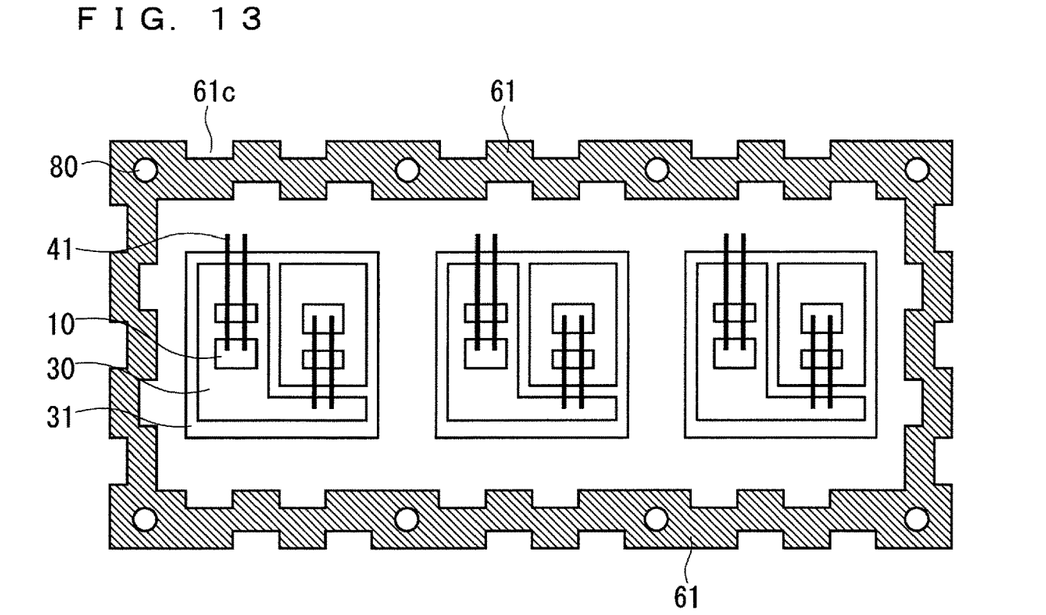
FIG. 13 is a top view of the semiconductor device according to the third embodiment where the external electrode, the resin portion of the case, and the heat sink are made transparent.
Figure 14:
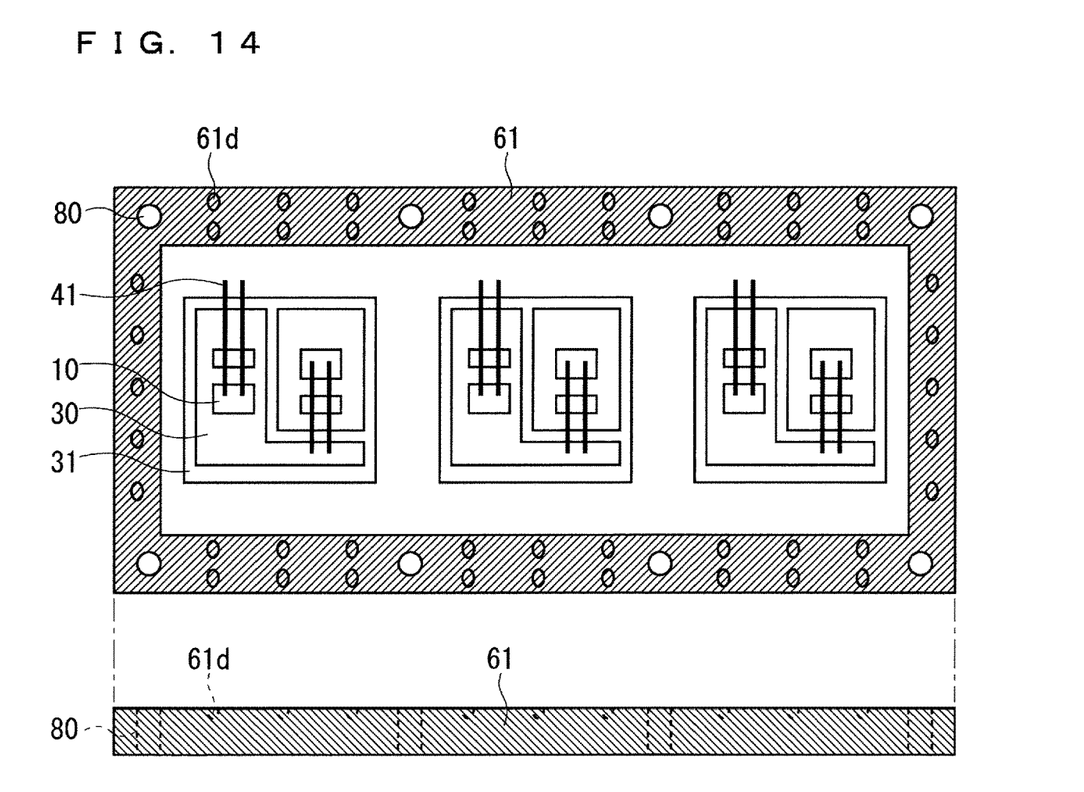
FIG. 14 is a top view of the semiconductor device according to the third embodiment where the external electrode, the resin portion of the case, and the heat sink are made transparent.

For example, as shown in FIG. 12, a through hole 61b may be formed passing through the surface pressure absorbing member 61 in the thickness direction (vertical direction). Further, as shown in FIG. 13, a plurality of depressed portions 61c may be formed on the side surfaces of the surface pressure absorbing member 61 to make the side surfaces uneven. Further, as shown in FIG. 14, a plurality of dimples 61d may be formed on the upper surface of the surface pressure absorbing member 61 to make the upper surface uneven. In this configuration, a resin portion of the case 60 is molded to cover a portion where the dimples 61d of the surface pressure absorbing member 61 are formed.

The present embodiment can bring about an effect of increasing adhesion between the resin of the case 60 and the surface pressure absorbing member 61. The through hole 61b and the depressed portions 61c may be provided for the purpose of preventing the other members inserted into the case 60 and the surface pressure absorbing member 61 from coming into contact with each other, or for the purpose of reducing the material cost and weight. The third embodiment can also bring about the effect of suppressing stress (surface pressure) applied to the case 60 and the heat sink 50 during fastening with the bolt as in the first embodiment.

Fourth Embodiment

Figure 15:
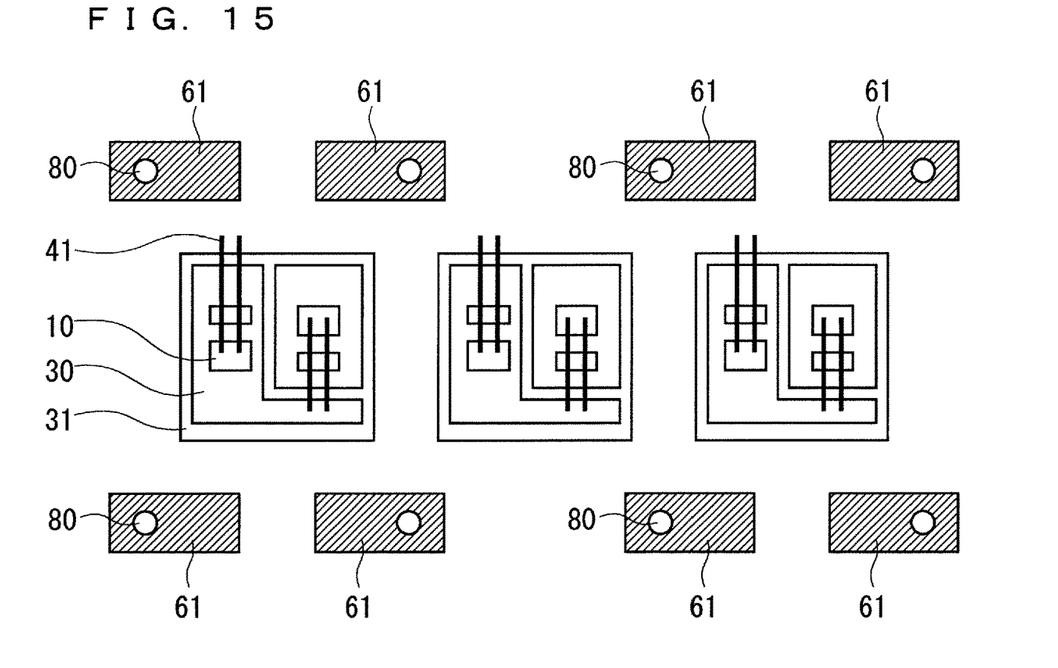
FIG. 15 is a top view of a semiconductor device according to a fourth embodiment where an external electrode, a resin portion of a case, and a heat sink are made transparent.

In the first to third embodiments, a plurality of fastening holes 80 are provided in one surface pressure absorbing member 61, but, in the fourth embodiment, only one fastening hole 80 is provided in one surface pressure absorbing member 61. That is, in the fourth embodiment, as shown in FIG. 15, one surface pressure absorbing member 61 is provided for each fastening hole 80. Each surface pressure absorbing member 61 has a plate shape. In the example shown in FIG. 15, a rectangular surface pressure absorbing member 61 is used.

Figure 16:
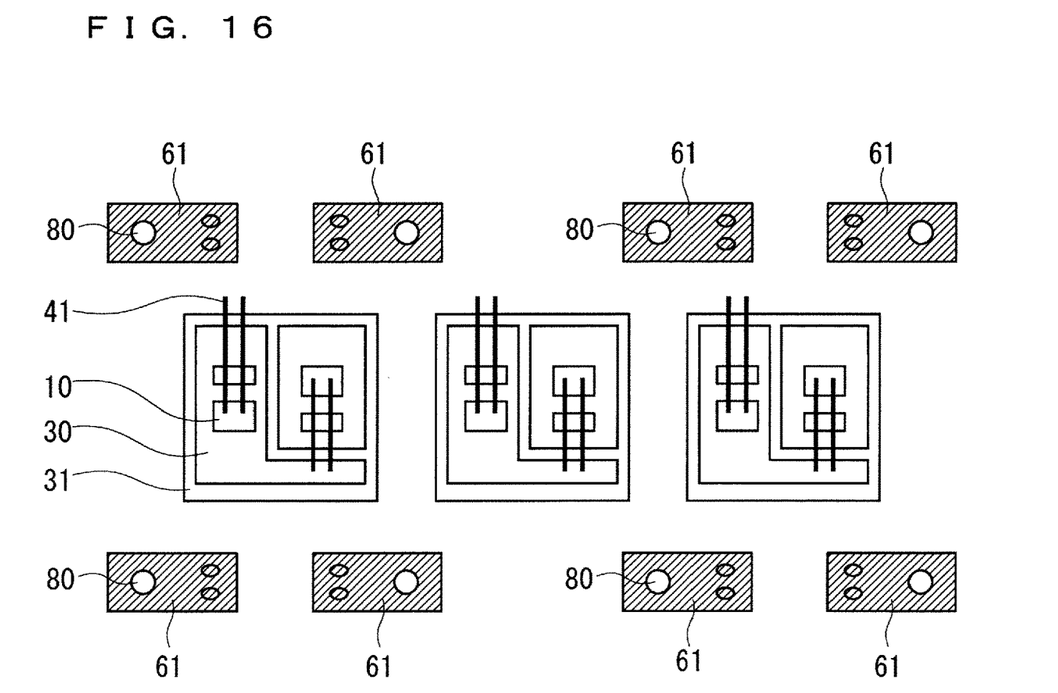
FIG. 16 is a diagram for describing a modification of a surface pressure absorbing member in the fourth embodiment.

Further, it is preferable that the surface pressure absorbing member 61 be disposed within the case 60 without being exposed on the side surfaces of the case 60. That is, it is preferable that the surface pressure absorbing member 61 be enclosed by the case 60 in plan view. This can reliably prevent the surface pressure absorbing member 61 from being separated from the resin portion of the case 60 to idly spin due to bolt fastening torque. Further, as shown in FIG. 16, a configuration where the third embodiment is applied to provide a plurality of dimples 61d on the upper surface of the surface pressure absorbing member 61 to increase adhesion between the resin of the case 60 and the surface pressure absorbing member 61 is also effective.

The fourth embodiment can bring about the effect of suppressing stress (surface pressure) applied to the case 60 and the heat sink 50 during fastening with the bolt as in the first embodiment. Further, although the warpage suppressing effect and the cooling effect are small compared to the first embodiment, a reduction in size of each surface pressure absorbing member 61 is expected to reduce the material cost and weight. Furthermore, a configuration where the plurality of surface pressure absorbing members 61 have the same shape can suppress an increase in the number of types of components and can thus increase productivity.

Fifth Embodiment

The thickness of the surface pressure absorbing member 61 shown in the first to fourth embodiments is uniform, but, in the fifth embodiment, the surface pressure absorbing member 61 has the portion around the fastening hole 80 (the region in contact with the bolt or washer) thicker than the other portions. In other words, a portion of the surface pressure absorbing member 61 other than the portion around the fastening hole 80 is made thinner, and the portion of the surface pressure absorbing member 61 around the fastening hole 80 is protruded in the thickness direction of the surface pressure absorbing member 61.

Figure 17:
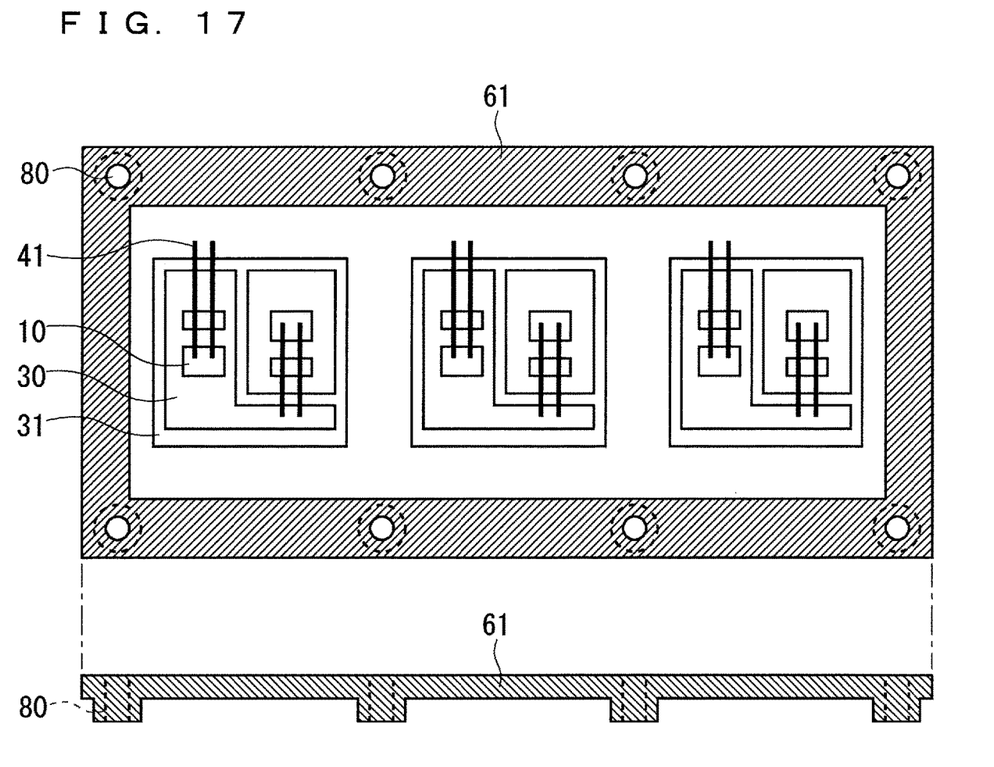
FIG. 17 is a top view of a semiconductor device according to a fifth embodiment where an external electrode, a resin portion of a case, and a heat sink are made transparent.
Figure 18:
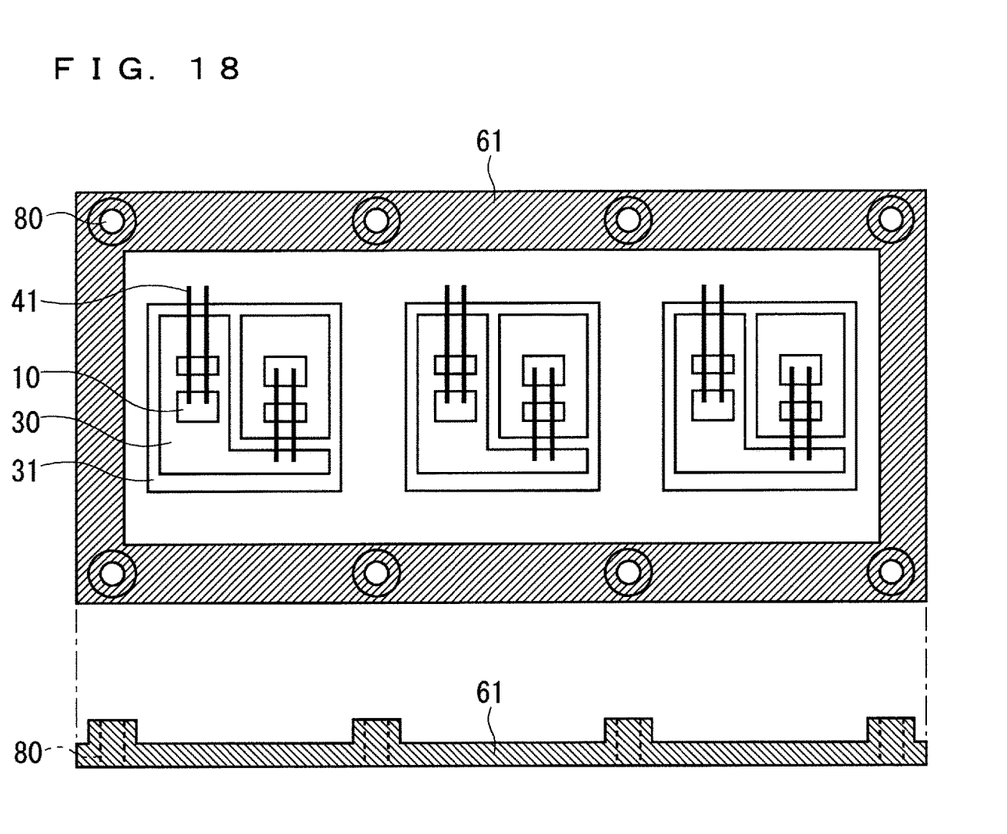
FIG. 18 is a top view of the semiconductor device according to the fifth embodiment where the external electrode, the resin portion of the case, and the heat sink are made transparent.
Figure 19:
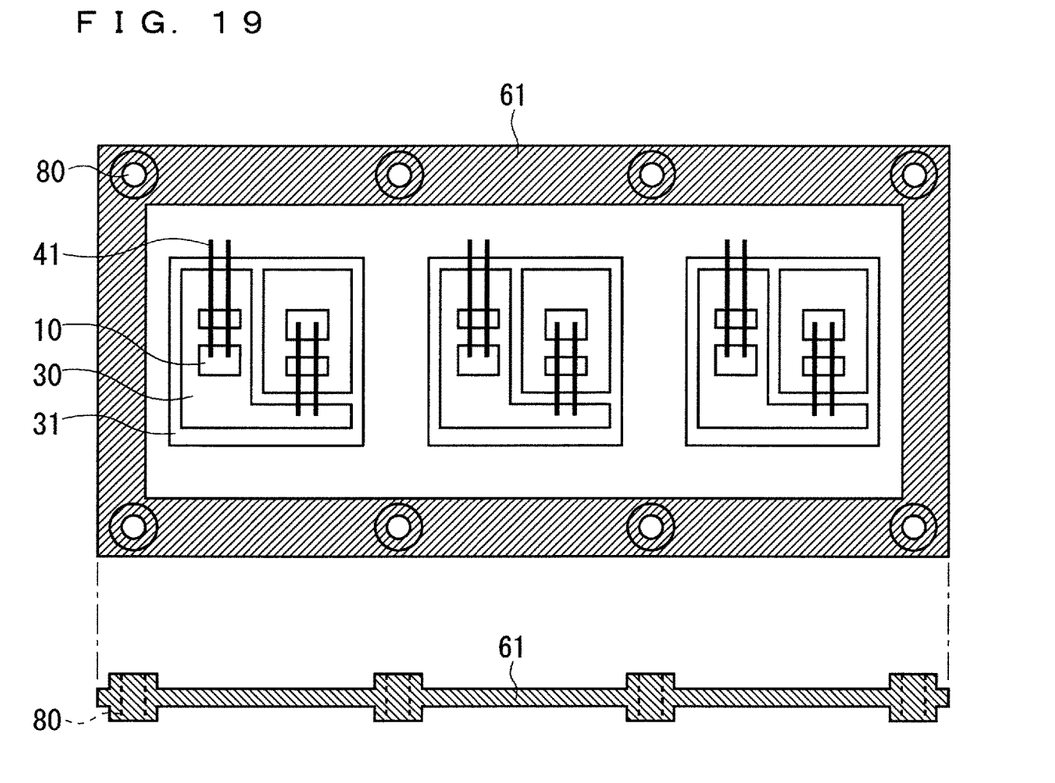
FIG. 19 is a top view of the semiconductor device according to the fifth embodiment where the external electrode, the resin portion of the case, and the heat sink are made transparent.

For example, as shown in FIG. 17, the portion of the surface pressure absorbing member 61 around the fastening hole 80 may be protruded downward. That is, in FIG. 17, the lower surface of the portion other than the portion around the fastening hole 80 is positioned higher to make the portion thinner. Further, as shown in FIG. 18, the portion of the surface pressure absorbing member 61 around the fastening hole 80 may be protruded upward. That is, in FIG. 18, the upper surface of the portion other than the portion around the fastening hole 80 is positioned lower to make the portion thinner. Further, as shown in FIG. 19, the portion of the surface pressure absorbing member 61 around the fastening hole 80 may be protruded in both directions, that is, downward and upward. In other words, in FIG. 19, the upper surface of the portion other than the portion around the fastening hole 80 is positioned lower, and the lower surface is positioned higher to make the portion thinner.

According to the present embodiment, at least in the portion around the fastening hole 80 (thick portion), the upper surface of the surface pressure absorbing member 61 is exposed from the case 60 and the lower surface of the surface pressure absorbing member 61 is brought into contact with the heat sink 50. This can bring about the effect of suppressing stress (surface pressure) applied to the case 60 and the heat sink 50 during fastening with the bolt as in the first embodiment.

Further, a configuration where the upper surface or the lower surface of the thin portion of the surface pressure absorbing member 61 is covered by the resin of the case 60 can bring about high adhesion between the resin of the case 60 and the surface pressure absorbing member 61 compared to the first embodiment. In order to further increase the adhesion, projections and depressions such as knurls may be provided on the side surface of the thick portion of the surface pressure absorbing member 61 (portion around the fastening hole 80).

Furthermore, the configuration where the surface pressure absorbing member 61 is partially formed thin is expected to reduce the material cost and weight.

Sixth Embodiment

In the above embodiments, the surface pressure absorbing member 61 is formed integrally with the case 60 by insert molding, but, in the sixth embodiment, the surface pressure absorbing member 61 is a component separate from the case 60. In this configuration, the surface pressure absorbing member 61 and the case 60 are bonded to each other with an adhesive in an assembly process of the semiconductor device. Note that the adhesive is applied only to a surface of the surface pressure absorbing member 61 that comes into contact with the case 60 and is not applied to a surface exposed from the case 60 (that is, a surface that comes into contact with the bolt and the heat sink 50).

The configuration where the case 60 and the surface pressure absorbing member 61 are bonded to each other with an adhesive eliminates the need of taking measures against the separation of the surface pressure absorbing member 61 (for example, an increase in thickness of the resin of the external electrode 40) and can thus contribute to a reduction in size of the semiconductor device. Further, since the number of members to be inserted when the case 60 is molded is reduced, the productivity of the case 60 is expected to increase. Further, the configuration where no adhesive is applied to the surface of the surface pressure absorbing member 61 that comes into contact with the bolt and the heat sink 50 can achieve metal touch of the fastening portion.

Note that the present invention can be implemented by any combination of the embodiments within the scope of the present invention, and each of the embodiments can be modified or omitted as appropriate.

Although the present invention has been described in detail, the above descriptions are illustrative in all aspects, and the present invention is not limited by the descriptions. It is understood that innumerable modifications not illustrated can be envisaged without departing from the scope of the present invention.

EXPLANATION OF REFERENCE SIGNS

10: semiconductor element
20: brazing filler metal
21: brazing filler metal
30: circuit pattern
31: insulation substrate
32: metal pattern
40: external electrode
41: wiring
50: heat sink
51: heat dissipation fin
60: case
61: surface pressure absorbing member
61*a*: beam portion
61*b*: through hole
61*c*: depressed portion
61*d*: dimple
70: encapsulating material
80: fastening hole.

The invention claimed is:

1. A semiconductor device comprising:
a semiconductor element;
a heat sink on which the semiconductor element is mounted;
a case made of resin, the case being mounted on the heat sink and containing the semiconductor element; and
a fastening hole passing through the case and the heat sink,
wherein
a surface pressure absorbing member is at least partially embedded in the case and positioned at portion including the fastening hole in plan view, the surface pressure absorbing member having a substantially flat plate shape and being higher in rigidity than the resin.

2. The semiconductor device according to claim 1, wherein
an upper surface of the surface pressure absorbing member at least around the fastening hole is exposed from the case, and a lower surface of the surface pressure absorbing member is in contact with the heat sink.

3. The semiconductor device according to claim 1, wherein
a plurality of the fastening holes are provided, and all of the plurality of fastening holes is formed in the surface pressure absorbing member.

4. A semiconductor device comprising:
a semiconductor element;
a heat sink on which the semiconductor element is mounted;
a case made of resin, the case being mounted on the heat sink and containing the semiconductor element; and
a fastening hole passing through the case and the heat sink,
wherein
the case includes a surface pressure absorbing member on a portion including the fastening hole in plan view, the surface pressure absorbing member having a plate shape and being higher in rigidity than the resin, and
the surface pressure absorbing member includes a portion extending on an outer peripheral portion of the case and a beam portion extending across an inside of the case.

5. The semiconductor device according to claim 1, wherein
the surface pressure absorbing member has a frame shape extending on an outer peripheral portion of the case.

6. The semiconductor device according to claim 5, wherein
the surface pressure absorbing member includes a beam portion extending across an inside of the case.

7. The semiconductor device according to claim 1, wherein
a plurality of the fastening holes and a plurality of the surface pressure absorbing members are provided, and
each of the plurality of surface pressure absorbing members has a shape including at least one fastening hole in plan view.

8. The semiconductor device according to claim 7, wherein
the plurality of surface pressure absorbing members are all identical in shape.

9. The semiconductor device according to claim 7, wherein
at least one of the plurality of surface pressure absorbing members has an L shape extending on two adjacent sides of the case.

10. The semiconductor device according to claim 7, wherein
at least one of the plurality of surface pressure absorbing members has a frame shape including a portion extending to an outer peripheral portion of the case and a portion extending across an inside of the case.

11. The semiconductor device according to claim 1, wherein
the surface pressure absorbing member has a through hole, a depressed portion, or a dimple formed in a portion other than a portion around the fastening hole.

12. The semiconductor device according to claim 1, wherein
the surface pressure absorbing member is enclosed by the case in plan view.

13. The semiconductor device according to claim 1, wherein
the surface pressure absorbing member has a portion around the fastening hole formed thicker than other portions.

14. The semiconductor device according to claim 13, wherein
the surface pressure absorbing member has projections and depressions formed on a side surface of the portion around the fastening hole.

15. The semiconductor device according to claim 1, wherein
the surface pressure absorbing member is insert-molded in the case.

16. The semiconductor device according to claim 1, wherein
the surface pressure absorbing member is bonded to the case with an adhesive.

17. The semiconductor device according to claim 1, wherein
the surface pressure absorbing member is higher in thermal conductivity than the resin.

18. The semiconductor device according to claim 1, wherein
the surface pressure absorbing member is made of Fe.

19. The semiconductor device according to claim 1, wherein
the surface pressure absorbing member is made of Cu.

20. The semiconductor device according to claim 1 further comprising a bolt configured to be inserted into the fastening hole to fasten the case and the heat sink to an external housing,
wherein the surface pressure absorbing member is identical in material to the bolt.

* * * * *